US012685175B2

(12) United States Patent
Legendre et al.

(10) Patent No.: US 12,685,175 B2
(45) Date of Patent: Jul. 14, 2026

(54) FLIP-CHIP BALL GRID ARRAY-TYPE INTEGRATED CIRCUIT PACKAGE FOR VERY HIGH FREQUENCY OPERATION

(71) Applicant: Teledyne e2v Semiconductors SAS, Saint Egreve (FR)

(72) Inventors: Olivier Legendre, Saint Egreve (FR); François Bore, Revel (FR); Benoit Dervaux, Grenoble (FR)

(73) Assignee: Teledyne e2v Semiconductors SAS, Saint Egreve (FR)

( * ) Notice: Subject to any disclaimer, the term of this patent is extended or adjusted under 35 U.S.C. 154(b) by 791 days.

(21) Appl. No.: 17/750,122

(22) Filed: May 20, 2022

(65) Prior Publication Data

US 2022/0375885 A1      Nov. 24, 2022

(30) Foreign Application Priority Data

May 24, 2021      (FR) ....................................... 2105375

(51) Int. Cl.
*H01L 23/58* (2006.01)
*H05K 1/181* (2026.01)
(Continued)

(52) U.S. Cl.
CPC ............ *H10W 44/20* (2026.01); *H05K 1/181* (2013.01); *H10W 70/685* (2026.01);
(Continued)

(58) Field of Classification Search
CPC ............... H01L 23/66; H01L 23/49816; H01L 23/79822; H01L 24/14; H01L 2223/6622; H01L 2224/1415; H01L 2224/16235; H01L 2924/15311; H01L 24/16; H01L 2224/73204; H01L 2224/16227; H01L 2224/0401; H01L 24/73;
(Continued)

(56) References Cited

U.S. PATENT DOCUMENTS

| 5,842,877 A | 12/1998 | Martensson et al. |
| 6,448,639 B1 * | 9/2002 | Ma ...................... H10W 90/701 |
| | | 257/691 |

(Continued)

FOREIGN PATENT DOCUMENTS

| JP | 4991296 | 5/2012 |
| JP | 5329737 | 8/2013 |

(Continued)

*Primary Examiner* — Niki H Nguyen
(74) *Attorney, Agent, or Firm* — Haynes and Boone, LLP

(57) ABSTRACT

The invention relates to a flip-chip integrated circuit package of the ball array type, wherein:
the underside of the package includes a plurality of receiving pads for signal, ground and solder balls;
stacks of signal and ground vias, electrically connected to respective receiving pads, pass vertically through the package's dielectric body forming a quasi-coaxial structure. In an upper part of the package body:
the signal vias are electrically connected to a lesser number of signal conductive bumps protruding from the upper surface of the package's dielectric body; and
at least two ground vias are connected by means of conductive projections to respective ground conductive bumps, forming a ring around the signal conductive bumps.

20 Claims, 5 Drawing Sheets

(51) Int. Cl.

| | |
|---|---|
| *H10W 44/20* | (2026.01) |
| *H10W 70/685* | (2026.01) |
| *H10W 90/00* | (2026.01) |
| *H10W 72/20* | (2026.01) |

(52) U.S. Cl.
CPC _H10W 90/701_ (2026.01); *H05K 2201/10378* (2013.01); *H05K 2201/10734* (2013.01); *H10W 44/212* (2026.01); *H10W 72/248* (2026.01); *H10W 90/724* (2026.01)

(58) Field of Classification Search
CPC ....... H01L 2224/73253; H01L 23/5389; H01L 2224/12105; H01L 25/0657; H01L 21/76898; H01L 23/3128; H01L 2224/48465; H01L 24/05; H01L 2224/04105; H01L 2224/49111; H01L 21/4857; H01L 24/06; H01L 2224/85205; H01L 23/5286; H01L 2225/06541; H01L 23/5384; H01L 21/486; H01L 2225/06513; H01L 2225/1058; H01L 24/17; H01L 2224/81191; H01L 25/0652; H01L 2224/97; H01L 2924/1532; H01L 23/5226; H01L 24/08; H01L 2224/16238; H01L 2224/08145; H01L 2924/1517; H01L 2224/81801; H01L 2224/81203; H01L 23/528; H05K 1/181; H05K 2201/10378; H05K 2201/10734
See application file for complete search history.

(56) References Cited

U.S. PATENT DOCUMENTS

| | | | |
|---|---|---|---|
| 6,624,521 B2 | 9/2003 | Staiculescu et al. | |
| 6,812,576 B1 | 11/2004 | Fazelpour et al. | |
| 6,891,266 B2 | 5/2005 | Kinayman et al. | |
| 7,492,146 B2 | 2/2009 | Behziz | |
| 7,847,404 B1 * | 12/2010 | Schwegler | H10W 72/00 |
| | | | 257/532 |
| 8,354,601 B2 | 1/2013 | Russell | |
| 8,542,494 B2 | 9/2013 | Mutnury et al. | |
| 9,059,490 B2 | 6/2015 | DeVries et al. | |
| 11,211,371 B2 | 12/2021 | Yu et al. | |
| 11,257,791 B2 | 2/2022 | Chen et al. | |
| 2003/0047356 A1 * | 3/2003 | Searls | H10W 70/65 |
| | | | 174/262 |
| 2003/0151133 A1 * | 8/2003 | Kinayman | H05K 1/0222 |
| | | | 257/713 |
| 2004/0217830 A1 | 11/2004 | Hansen et al. | |
| 2005/0098348 A1 | 5/2005 | Okumichi et al. | |
| 2006/0038633 A1 | 2/2006 | Aguirre et al. | |
| 2006/0226928 A1 * | 10/2006 | Henning | H05K 1/025 |
| | | | 333/260 |
| 2009/0077523 A1 | 3/2009 | Jiang et al. | |

FOREIGN PATENT DOCUMENTS

| | | | |
|---|---|---|---|
| TW | 2021-09823 A | 3/2021 | |
| TW | 2021-17975 A | 5/2021 | |

* cited by examiner

200

FLIP-CHIP BALL GRID ARRAY-TYPE INTEGRATED CIRCUIT PACKAGE FOR VERY HIGH FREQUENCY OPERATION

CROSS REFERENCE TO RELATED APPLICATIONS

This application claims priority to French Patent Application No. FR2105375 filed May 24, 2021 and entitled "Boîtier de circuit intégré à puce retournée de type à matrice de billes pour fonctionnement à très haute fréquence," which is incorporated herein by reference in its entirety.

DESCRIPTION

The invention is in the field of integrated circuit packages. More particularly, it concerns a Flip-Chip Ball Grid Array (FCBGA)-type package, which is to say adapted to carry a flip-chip (FC) and to connect to a printed circuit board, through an array of solder balls referred to as a Ball Grid Array (BGA).

A Ball Grid Array (BGA) is a type of surface mount package used for integrated circuits. A BGA package can have more interconnection pins than a flat or dual inline package (DIP), as the entire bottom surface of the device can be used for interconnecting, instead of just the perimeter. The interconnections can also be shorter than in other types of packages, and thus have lower parasitic inductance, leading to better high frequency performance.

Flip-Chip (FC) technology is a process for interconnecting integrated circuits (or "electronic chips") to external circuits by means of solder bumps deposited on pads located on the upper surface of the chip. Solder bumps are deposited on the chip pads during the final stage of chip manufacturing. Then the chip is flipped over so that its top side is facing down, and aligned so that the bumps line up with corresponding pads on the external circuit; then the bumps are re-melted to complete the interconnection. This is in contrast to wire connection, where the chip is mounted upright and wires are used to interconnect the chip pads to external circuitry. Compared to the conventional bridging technique, this approach allows for further miniaturization and a reduction in parasitic inductances, leading to better high-frequency performance.

FCBGA packages combine the two technologies: on their underside they carry an array of solder balls to allow their interconnection to an external circuit (typically a printed circuit board) and, on their upper side they have conductive bumps to interconnect to a flip-chip.

The flip-chip interconnection bumps have a spacing that is much smaller than that of the BGA arrays' solder balls. The FCBGA package must manage this step change without causing impedance breaks that would be detrimental to proper operation at very high frequency (1 GHz or more, even 10 GHz or more).

U.S. Pat. No. 9,059,490 relates to an FCBGA package designed to operate at up to 60 GHz. The underside of the package carries a "signal" ball surrounded by "ground" balls; the signal ball is connected to the central conductor of a microstrip transmission line carried by a printed circuit board, and the ground balls are connected to its ground conductors. A vertical interconnection ("via") that passes through the dielectric body of the package and emerges from its upper surface is connected to each ball; the set of vias thus forms a quasi-coaxial structure that is well-suited to transmitting microwave signals. The central via connects the signal conductor of a stripline transmission line carried by a ceramic substrate, and the peripheral vias connect this transmission line's ground planes. Another smaller diameter quasi-coaxial structure of vias that passes through the ceramic substrate connects this line to a flip-chip fixed to the underside of the ceramic substrate, which protrudes laterally from the dielectric body of the package. The use of a transmission line interconnecting two quasi-coaxial structures of vias makes it possible to adapt the pitch of the BGA array and of the flip-chip, but at the expense of some manufacturing complexity and relatively significant dimensions.

U.S. Pat. No. 6,891,266 and US 2006/0038633 relate to FCBGA packages comprising quasi-coaxial structures of vias that connect an array of solder balls on the underside of the package to a planar transmission line on its upper face. Again, the need to provide a planar transmission line on the package's upper face increases the package's dimensions.

The invention aims to overcome, in whole or in part, the aforementioned drawbacks of the prior art. More particularly, it aims to provide simpler and/or less bulky FCBGA packages while ensuring operation at frequencies that can exceed 10 GHz, or even 20 GHz, for example up to 59 GHz.

According to the invention, this objective is achieved by using a quasi-coaxial structure of reduced-diameter vias in the upper part of the package to correspond to the spacing between a flip-chip's interconnection bumps. Furthermore, the signal is carried by a plurality of vias at the center of the structure, whose number decreases at the same time as the diameter of the vias, which makes it possible to maintain a constant impedance. In this way, the change of spacing happens within the set of vias, without needing to go through a transmission line, which makes it possible to reduce the complexity and the size of the package, while maintaining good performance at very high frequency.

According to a first aspect of the present disclosure there is provided a flip-chip ball grid array type integrated circuit package, comprising a dielectric body with an upper face and an underside in which:

the underside of the dielectric body comprises a plurality of receiving pads for connection purposes, comprising a central signal receiving pad and peripheral ground receiving pads surrounding said signal receiving pad;

a plurality of stacks of signal vias, electrically connected to the signal receiving pad, and passing vertically through said dielectric body;

a plurality of stacks of ground vias, electrically connected to the ground receiving pads, passing vertically through said dielectric body and forming a ring around the signal vias;

characterized in that, in an upper portion of the dielectric body:

the signal vias are electrically connected to a lesser number of signal conductive bumps protruding from the upper face of the dielectric body; and at least two ground vias are connected, via conductive protrusions, to respective ground conductive bumps that protrude from the upper face of the dielectric body and form a ring around the signal conductive bumps.

The number of signal conductive bumps protruding from the upper face of the dielectric body may be less than the number of stacks of signal vias passing through the dielectric body.

The conductive protrusions may extend from the at least two ground vias and towards the signal vias.

The lesser number of signal conductive bumps may comprise one or more signal conductive bumps.

According to particular embodiments of the invention:

Said dielectric body may consist of a stack of dielectric layers.

Conductive ground planes can be arranged between at least some of said dielectric layers, the ground planes having openings that have substantially the same diameter and are aligned in a vertical direction perpendicular to the ground planes; the stacks of signal vias, electrically connected to the signal receiving area, can pass vertically through said dielectric layers corresponding to a central region of the ground planes' openings; the stacks of ground vias, electrically connected to the ground receiving pads, can pass vertically through said dielectric layers outside the ground planes' openings; and the ground vias connected by means of conductive projections to respective conductive bumps can be located on either side of a said ground plane's opening. In this case, all the ground vias can be connected by means of said conductive projections to respective conductive bumps located inside said opening.

The signal vias can be interconnected by conductive bridges

The stacks of ground vias may not extend through a lower portion of the package, the electrical connection with the ground receiving pads then being provided by other stacks of vias, forming a larger diameter ring around the signal vias than the ring formed by the ground vias.

The dielectric body may be made of either ceramic material or organic material.

The package may include a single signal-conducting bump.

The diameter of the ground planes' openings, the number of stacks of signal vias, the diameter of the ring(s) of vias around the signal vias, the number of ground conductive bumps and the diameter of the ring that these last shapes form around the signal bump(s) can be chosen to ensure continuity of impedance between the receiving pads for the solder balls and the conductive bumps protruding from the upper face of the dielectric body.

The package may carry a semiconductor flip-chip that is electrically connected to the conductive bumps protruding from the upper face of the dielectric body.

According to another aspect of the present disclosure there is provided a printed circuit board comprising a signal conductor and at least one ground plane forming a transmission line for microwave signals, the integrated circuit board carrying a package according to the first aspect, the signal receiving pad of said package being connected to said signal conductor by means of a solder ball and the ground receiving pads of said package being connected to said ground plane(s), also by means of solder balls.

Other characteristics, details and advantages of the invention will become apparent upon reading the description given in reference to the appended drawings provided as an example and that represent, respectively:

Figure 1:
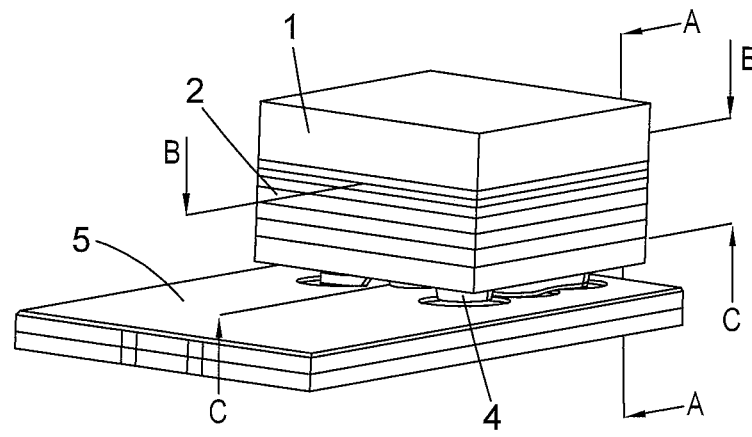
FIG. 1 is a perspective view of a package according to the embodiment.

FIG. 1 shows an FCBGA package 2 mounted on a printed circuit board (PCB) 5 by means of a solder ball array 4 on its underside and bearing a flip-chip 1 on its upper face.

Figure 2:
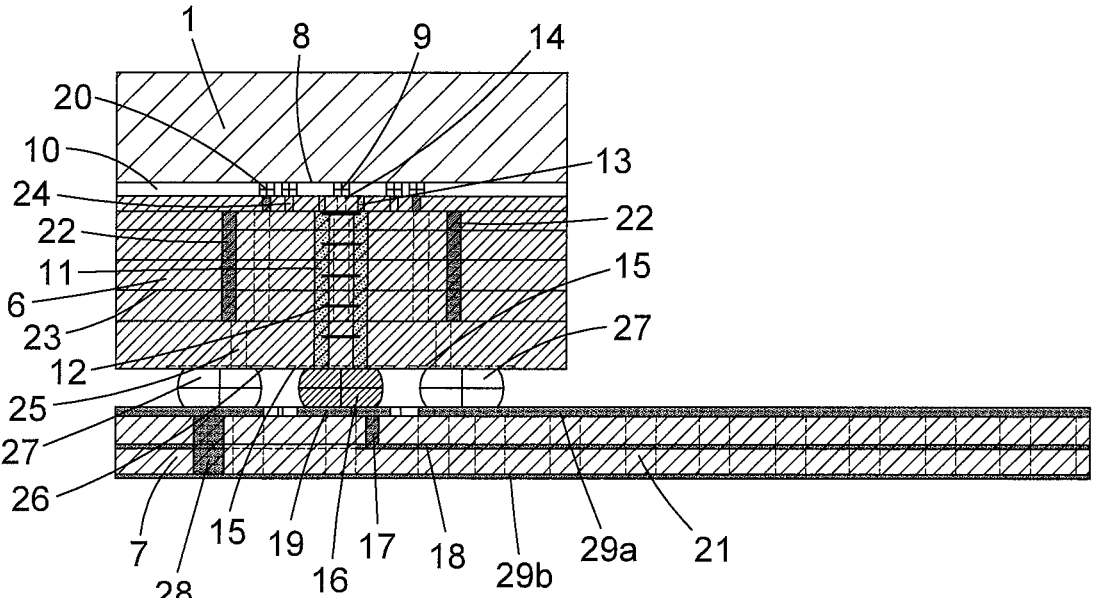
FIG. 2 is a first cross-sectional view of the package in FIG. 1 according to a first embodiment of the invention, based on ceramic technology.
Figure 3:
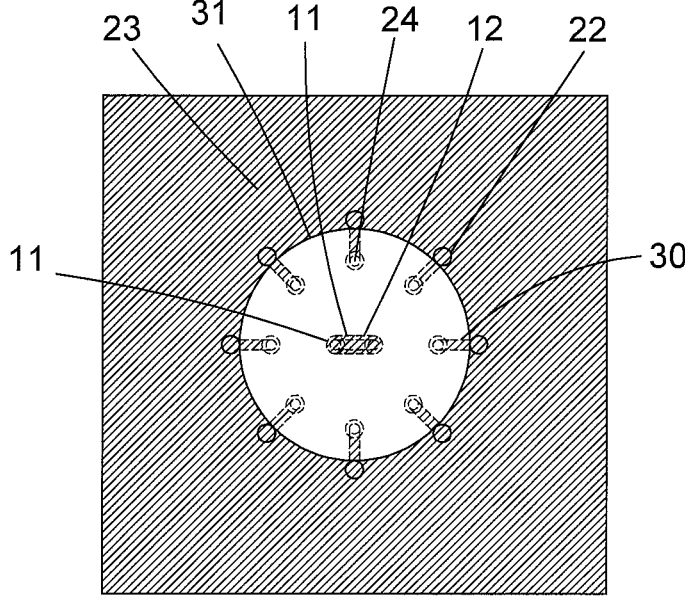
FIG. 3 is a second cross-sectional view of the package in FIG. 1 according to said first embodiment of the invention.
Figure 4:
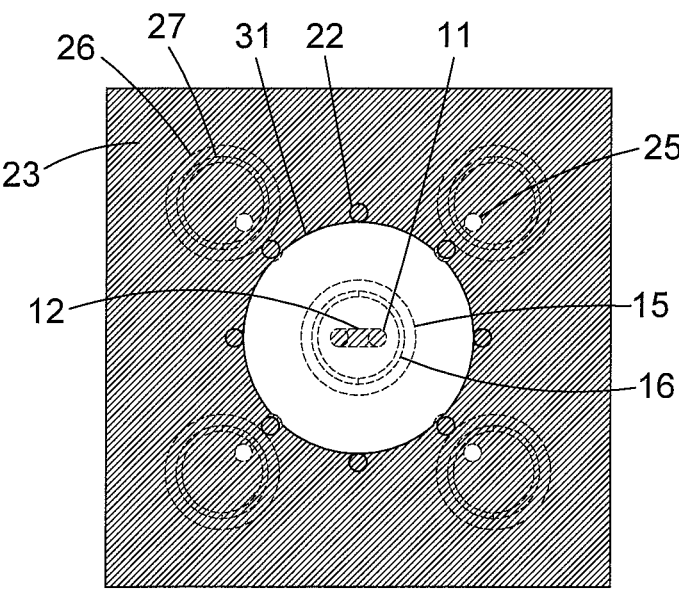
FIG. 4 is a third cross-sectional view of the package in FIG. 1 according to said first embodiment of the invention.
Figure 5:
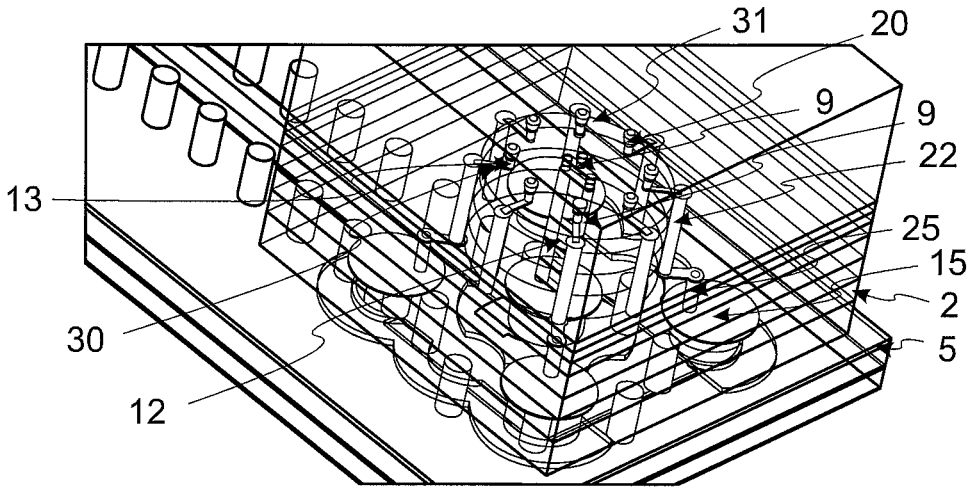
FIG. 5 is a transparent view of the package in FIG. 1 according to said first embodiment of the invention.

FIG. 2, FIG. 3 and FIG. 4 show three cross-sectional views—according to sections A-A, B-B and C-C respectively—of package 2 according to a first embodiment made of ceramic material. FIG. 5 is a transparent view of this same package 2.

PCB 5 comprises a dielectric body 7, inside which is arranged a signal line 18 arranged between an upper ground plane 29*a*, on the upper surface of the PCB, and a lower ground plane 29*b*, on the bottom surface of the PCB, and is framed by screening vias 21 connecting the two ground planes. The signal line 18 is connected by means of a micro-via 17 to an interconnection area ("land") 19 located on the upper face of the PCB and insulated from the ground planes; a so-called "signal" solder ball 16 is arranged on this interconnection pad 19. So-called "ground" solder balls 27 are arranged on the upper ground plane 29*a* so as to surround the signal ball 16. Corresponding to the ground balls 27, ground vias 28 connect the upper ground plane 29*a* to the lower ground plane 29*b*.

The body of package 2 consists of a stack of dielectric layers (of ceramic material, in the embodiments of FIG. 2-FIG. 4). Optionally, all or some of these dielectric layers, and in particular the upper dielectric layer of the stack, carry on their upper face a conductive ground plane 23. These conductive ground planes have vertically-aligned central openings 31. The underside of the package 2 carries conductive receiving pads corresponding to the solder balls: a central signal receiving pad 15 for the interconnection with the signal ball 19 and peripheral ground receiving pads 26 surrounding said signal receiving area 15 and intended for interconnection with the ground balls 27. The upper face of the package carries conductive bumps 9, 20 intended to allow interconnection with the active face 8 of the flip-chip 1. More specifically, one or more signal conductive bumps 9 are surrounded by ground conductive bumps 20. Vias extending through the dielectric stack connect the signal conductive bump or bumps 9 to the signal receiving pads 15 on the underside, and the ground conductive bumps 20 to the ground receiving pads 26. The space between the upper surface of the package 2, the conductive bumps and chip 1 is filled with an "underfill" resin 10.

The signal propagating along signal line 18 is vertically routed directly to chip 1 by a plurality of stacked signal vias 11, two in the illustrated embodiment, interconnected by means of conductive bridges 12. In the upper part of the stack (which is to say in the upper dielectric layer) these vias—identified by reference 13—have a reduced radius for feasibility reasons.

The use of bridges 12, which is non-essential, makes it possible to increase the frequency of a resonance that limits the interconnection's RF bandwidth, this resonance being produced by the signal rebounding between a possible impedance fault at the crossing of the PCB—package interface and at the crossing of the package—chip interface, marked by the surface current density rotating around a horizontal axis inside the plurality of signal vias 11 then acting in the manner of a resonant cavity. Indeed these bridges reduce the resonant cavity's volume and thus the resonant frequency's wavelength, and thus increase the package's maximum frequency of use.

The stacks of signal vias 11 are surrounded by an ideally-concentric ring composed of a plurality of stacked ground vias 22, eight of them in the illustrated embodiment. The number of stacks of signal vias 11 and the diameter (more generally: the lateral dimensions) of the ring of stacked ground vias 22 are chosen such that the characteristic impedance of the quasi-coaxial structure 11, 22 is substantially identical to that of the transmission line 18, 29*a*, 29*b*, typically 50 Ohm. More specifically, for a given value of characteristic impedance, the higher the number of stacks of signal vias 11, the further apart the stacks of ground vias 22 should be.

If the dielectric layers of the package body carry ground planes 23 with central openings 31, the stacks of ground vias 22 are located outside of said openings, for example in a position tangential to their edges. The stacks of signal vias 11, on the other hand, are found in the center of said openings.

The spacing of the conductive ground bumps 20, which corresponds to that of the pads on the active face 8 of the chip 1 (not shown), is typically tighter than that of the stacks of ground vias 22. If this were not the case, the chip would have to have an unnecessarily increased surface area, which would increase the cost. As can be seen in FIG. 3, the stacks of ground vias 22 stop before reaching the top layer (or, more generally, a group of top layers) of the dielectric stack. This last layer is crossed through by ground vias 24 which also form a ring around the signal vias 11, but of a smaller diameter to correspond to the positioning of respective pads on the active face 8 of the chip 1. More specifically, the vias 24 are inside the opening 31 of the ground plane 23 located between the upper dielectric layer and the one that is immediately below it, and are connected to this ground plane (or to the upper end of the stacks of vias 22) by conductive projections 30. The ground conductive bumps 20 are arranged corresponding to the upper ends of the vias 24.

The narrowing of the circular ring of ground vias tends to reduce the characteristic impedance of the quasi-coaxial structure. To avoid impedance breakdown, a single signal conducting bump 9 is laid on the top layer's bridge 12 (more typically, there will be a lesser number of signal bumps 9 than there are stacks of signal vias 11).

The decoupling of the radius of the ring of ground vias 24 on the upper part of the body of the package from the radius of the ring of ground vias 22 on the central part of the body of the package thus makes it possible to avoid an impedance fault appearing near the chip's interconnection. It should be noted that the electrical connection between the ground vias 22 and 24 is made by a small width of copper (projections 30) to avoid creating a capacitive fault (decreased capacitive impedance) that would be produced by a narrowing of the opening 31, and therefore a rapprochement between the ground plane 23 and the signal vias 11.

In the lower part of the package body, the ring of ground vias 22 of the central part gives way to another ring of ground vias 25, of larger diameter. This makes it possible, on the one hand, to align, relatively, with the spacing of the ground balls 27, and, on the other hand, to compensate for the capacitive fault caused by the proximity between the ground balls' receiving pads 26 and the signal ball's receiving pad 15; this proximity, in turn, is due to the significant size of these receiving pads compared to the balls' footprint, which is typical of ceramic substrate technology.

Figure 6:
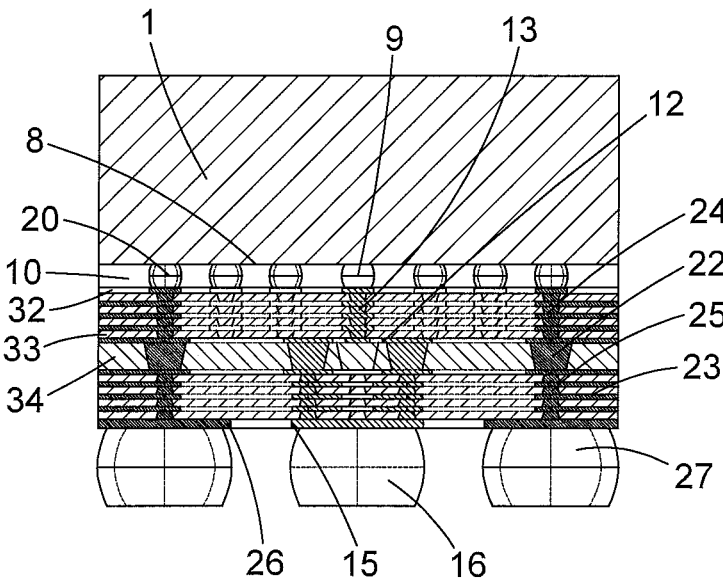
FIG. 6, is a first cross-sectional view of the package in FIG. 1 according to a second embodiment of the invention, based on organic technology.
Figure 7:
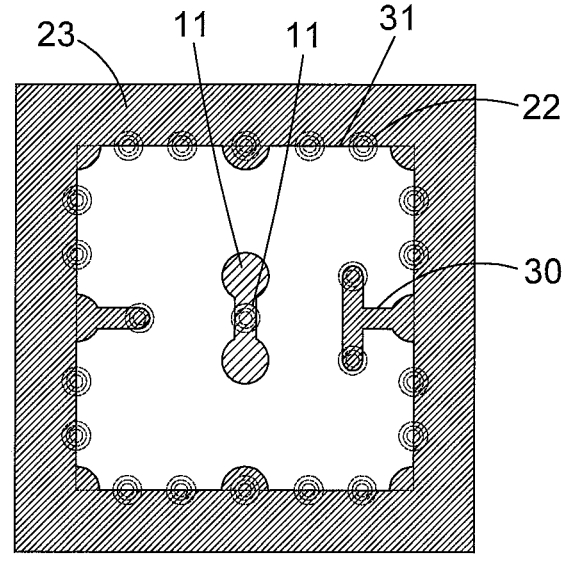
FIG. 7, is a second cross-sectional view of the package in FIG. 1 according to said second embodiment of the invention.
Figure 8:
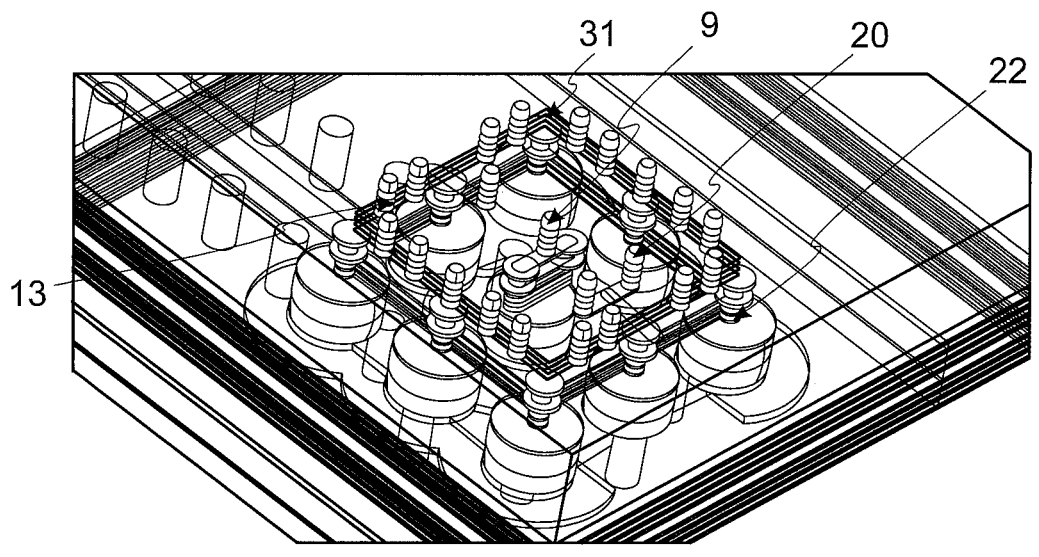
FIG. 8, is a transparent view of the package in FIG. 1 according to said second embodiment of the invention.

FIG. 6 and FIG. 7 show two cross-sectional views—according to sections A-A, and B-B respectively—of package 2 according to a second embodiment, made of organic material. FIG. 8 is a transparent view of this same package.

As in the case of the ceramic package in FIG. 2-FIG. 5, the body of package consists of a stack of dielectric layers, this time made of organic material. More specifically, it is possible to distinguish a central part 34 consisting of thicker layers, or even one single thick layer, and upper and lower end parts 33 consisting of thinner layers. A solder-mask layer 32 can cover the upper and lower faces, revealing only the electrical interconnection regions.

Compared to the embodiment made of ceramic material, the package made of organic material in FIG. 6-FIG. 8 can have receiving pads 15, 26 for smaller-dimension solder balls. For this reason, it is unnecessary to provide an enlargement of the ring of ground vias in the lower part of the package. In the upper part of the package, the signal can be conveyed by a single stack of vias 13.

Figure 9:
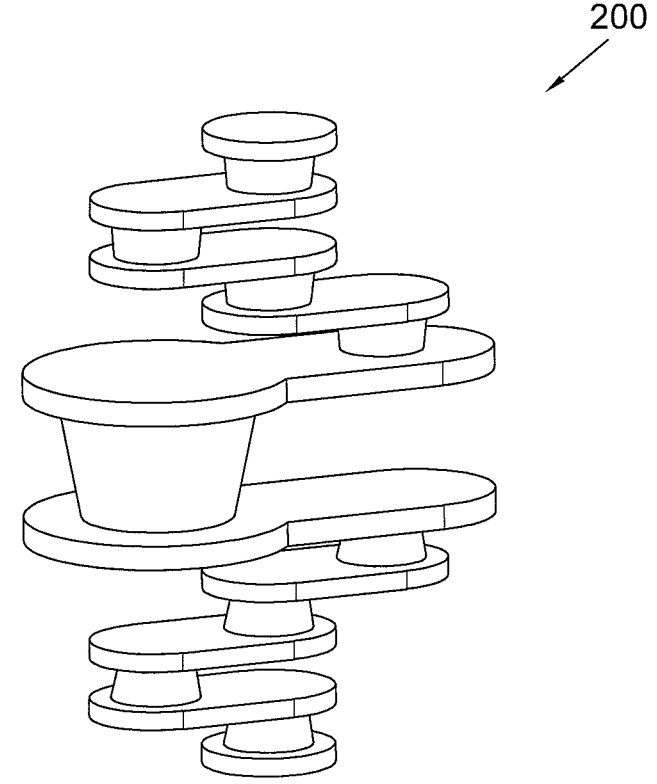
FIG. 9, is a detailed view of a stack of vias according to said second embodiment of the invention.

The vias 22, 11 that pass through the package body made of organic material can be produced by laser ablation (as illustrated) or mechanically. The various stacks of ground vias 25, 24 and of signal vias 13, 11 can be broken up so that the vias are not strictly stacked but slightly offset in relation to their counterpart in the top and/or bottom layer, ideally offset by a capture pad diameter, in order to improve the assembly's reliability and, more specifically, the thermomechanical stress resistance. FIG. 9 illustrates the structure of such a stack of vias 200 (which may comprise a stack of ground vias 25, 24 and/or signal vias 13, 11).

Certain features of the package in FIG. 6-FIG. 8 do not directly result from the use of an organic material, but constitute design choices. It basically involves that the opening in the ground planes is larger and square-shaped, and above all that only some of the ground solder bumps are brought closer to the signal solder bump, the other ground solder bumps forming a ring of the same lateral dimensions as the quasi-coaxial structure of vias 22. More specifically, three ground solder bumps on either side of the signal bump 9 are brought closer to the signal bump 9 (it would have been possible to bring together only two, but it is preferable to "split" [or duplicate] one to provide a passage for a signal line). The interconnection's sizing (determining the number of ground bumps to bring closer to the signal bump and their exact position) must be done in such a way as to ensure characteristic impedance continuity between the PCB and the flip-chip.

The invention has been described in reference to two particular embodiments, but variants can be considered. Different dielectric and conductive materials can be implemented, and different fabrication techniques can be employed. The number, spacing and relative position of the signal and ground vias in the various parts of the package body (lower, central, upper) can be determined by the designer according to the specific constraints of each application, while taking care to ensure the absence of impedance faults throughout the interconnection. Furthermore, the package's dielectric body can be solid, although a multi-layer structure is generally preferable. In addition, the package may not be intended to be connected to a printed circuit board via solder balls, but to be placed in an adapter "socket", in which case the receiving pads 15, 26 make contact with spring connectors.

The invention claimed is:

1. A flip-chip ball grid array type integrated circuit package comprising:

a dielectric body having an upper face and an underside in which:

the underside of the dielectric body comprises a plurality of receiving pads for means of connection, comprising a central signal receiving pad and peripheral ground receiving pads surrounding the central signal receiving pad;

a plurality of stacks of signal vias, electrically connected to the central signal receiving pad, and passing vertically through the dielectric body;

a plurality of stacks of ground vias, electrically connected to the peripheral ground receiving pads, passing vertically through the dielectric body and forming a ring around the plurality of stacks of signal vias; wherein, in an upper part of the dielectric body:

the plurality of stacks of signal vias are electrically connected to a lesser number of signal conducting bumps projecting from the upper face of the dielectric body; and at least two ground vias are connected, by means of conductive projections, to respective ground conductive bumps, projecting from the upper face of the dielectric body and forming a ring around signal conducting bumps.

2. The package according to claim 1, wherein the dielectric body consists of a stack of dielectric layers.

3. The package according to claim 2, wherein:

conductive ground planes are arranged between at least some of the dielectric layers, the conductive ground planes having openings that have substantially the same diameter and are aligned in a vertical direction, perpendicular to the conductive ground planes;

the stacks of signal vias, electrically connected to the signal receiving pad, pass vertically through the dielectric layers corresponding to a central region of the openings of the ground planes;

the stacks of ground vias, electrically connected to the ground receiving pads, pass vertically through the dielectric layers outside of the openings of the ground planes; and the ground vias connected, by means of conductive projections, to respective conductive bumps, are located on either side of the opening of the conductive ground plane.

4. The package according to claim 3, wherein all the ground vias are connected by means of the conductive projections, to respective ground conductive bumps located inside the opening.

5. The package according to claim 1, wherein the plurality of stacks of signal vias are interconnected by conductive bridges.

6. The package according to claim 4, wherein the plurality of stacks of signal vias are interconnected by conductive bridges.

7. The package according to claim 6, wherein the plurality of stacks of ground vias do not extend through a lower part of the package, an electrical connection with the ground receiving pads being provided by other stacks of ground vias, forming a ring around the plurality of stacks of signal vias having a larger diameter than the diameter of the ring formed by the stacks of ground vias.

8. The package according to claim 1, wherein the stacks of ground vias do not extend through a lower part of the package, an electrical connection with the ground receiving pads being provided by other stacks of ground vias, forming a ring around the plurality of stacks of signal vias having a larger diameter than the diameter of the ring formed by the plurality of stacks of ground vias.

9. The package according to claim 8, wherein the dielectric body is made of ceramic material.

10. The package according to claim 8, wherein the dielectric body is made of organic material.

11. The package according to claim 8, comprising one signal conducting bump.

12. The package according to claim 3, wherein the diameter of the openings of the ground planes, the number of stacks of signal vias, the diameter of the ring(s) of ground vias around the plurality of stacks of signal vias, the number of ground conductive bumps and the diameter of the ring that the ground conductive bumps forms around the signal conducting bump or bumps are chosen to ensure impedance continuity between the pads for solder balls and the ground conductive bumps projecting from the upper face of the dielectric body.

13. The package according to claim 1, wherein the dielectric body is made of organic material.

14. The package according to claim 1, comprising one signal conducting bump.

15. The package according to claim 3, wherein the diameter of the openings of the ground planes, the number of stacks of signal vias, the diameter of the ring(s) of ground vias around the plurality of stacks of signal vias, the number of ground conductive bumps and the diameter of the ring that the ground conductive bumps forms around the signal conducting bump or bumps are chosen to ensure impedance continuity between the pads for solder balls and the ground conductive bumps projecting from the upper face of the dielectric body.

16. The package according to claim 1, carrying a flipped semiconductor chip, electrically connected to the ground conductive bumps projecting from the upper face of the dielectric body and to the signal conductive bumps projecting from the upper face of the dielectric body.

17. The package according to claim 15, carrying a flipped semiconductor chip, electrically connected to the ground conductive bumps projecting from the upper face of the dielectric body.

18. A printed circuit board comprising:

a signal conductor;

and at least one ground plane forming a transmission line for microwave signals, the printed circuit board carrying a package according to claim 1, the central signal receiving pad of the package being connected to the signal conductor by means of a solder ball and the peripheral ground receiving pads of the package also being connected to the at least one ground plane by means of solder balls.

19. A printed circuit board comprising:

a signal conductor;

and at least one ground plane forming a transmission line for microwave signals, the printed circuit board carrying a package according to claim 3, the central signal receiving pad of the package being connected to the signal conductor by means of a solder ball and the peripheral ground receiving pads of the package also being connected to the ground plane(s) by means of solder balls.

20. A printed circuit board comprising:

a signal conductor;

and at least one ground plane forming a transmission line for microwave signals, the printed circuit board carrying a package according to claim 8, the signal receiving pad of the package being connected to the signal conductor by means of a solder ball and the ground receiving pads of the package also being connected to the at least one ground plane by means of solder balls.

* * * * *